United States Patent
Park et al.

(10) Patent No.: US 11,653,549 B2
(45) Date of Patent: *May 16, 2023

(54) DISPLAY DEVICE

(71) Applicant: SAMSUNG DISPLAY CO., LTD., Yongin-si (KR)

(72) Inventors: Junhyun Park, Yongin-si (KR); Sunkwang Kim, Yongin-si (KR); Kangmoon Jo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 111 days.

This patent is subject to a terminal disclaimer.

(21) Appl. No.: 17/170,313

(22) Filed: Feb. 8, 2021

(65) Prior Publication Data

US 2021/0167141 A1 Jun. 3, 2021

Related U.S. Application Data

(63) Continuation of application No. 16/376,608, filed on Apr. 5, 2019, now Pat. No. 10,916,595.

(30) Foreign Application Priority Data

Jul. 6, 2018 (KR) .................. 10-2018-0078935

(51) Int. Cl.
  *H01L 27/32* (2006.01)
  *H01L 51/52* (2006.01)
  *H01L 51/00* (2006.01)

(52) U.S. Cl.
  CPC ...... *H01L 27/3223* (2013.01); *H01L 27/3246* (2013.01); *H01L 51/0096* (2013.01); *H01L 51/5253* (2013.01)

(58) Field of Classification Search
  CPC ............. H01L 27/3223; H01L 51/5253; H01L 51/0096; H01L 27/3246; H01L 27/3258; Y02E 10/549; Y02P 70/50; Y02P 70/02
  See application file for complete search history.

(56) References Cited

U.S. PATENT DOCUMENTS 7,772,766 B2   8/2010   Aoki
9,905,629 B2   2/2018   Kim et al.
(Continued)

FOREIGN PATENT DOCUMENTS

JP   2008-282029   11/2008
JP   2010-164765   7/2010
(Continued)

OTHER PUBLICATIONS

Notice of Allowance dated Oct. 7, 2020 In Corresponding U.S. Appl. No. 16/376,608.

*Primary Examiner* — Savitri Mulpuri
(74) *Attorney, Agent, or Firm* — F. Chau & Associates, LLC

(57) ABSTRACT

A display device includes a substrate, a first insulating layer disposed on the substrate, a through portion passing through the substrate and the first insulating layer, a display unit disposed on the first insulating layer and including a plurality of pixels surrounding at least a portion of the through portion, and a dummy pixel unit. Each pixel includes a light-emitting element including a pixel electrode and an opposite electrode facing each other, and an emission layer disposed between the pixel electrode and the opposite electrode. The dummy pixel unit includes a plurality of dummy pixels disposed between the through portion and the display unit, and including a metal pattern including a same material as the pixel electrode. The dummy pixels are disposed adjacent to the display unit.

22 Claims, 17 Drawing Sheets

(56) References Cited

U.S. PATENT DOCUMENTS

| | | |
|---|---|---|
| 9,940,888 B2 | 4/2018 | Ryoo et al. |
| 10,170,534 B1 | 1/2019 | Kim et al. |
| 10,193,102 B2 | 1/2019 | Kanaya |
| 2014/0292827 A1 | 10/2014 | Kang et al. |
| 2015/0102312 A1 | 4/2015 | Lee et al. |
| 2015/0248861 A1 | 9/2015 | Kong et al. |
| 2015/0294618 A1* | 10/2015 | Park ................ G09G 3/3291 345/78 |
| 2016/0155791 A1 | 6/2016 | Kim et al. |
| 2016/0189585 A1* | 6/2016 | Na ................ G09G 3/3233 345/55 |
| 2016/0335950 A1* | 11/2016 | Kang ................ G09G 3/3233 |
| 2016/0363909 A1 | 12/2016 | Kang et al. |
| 2016/0372535 A1 | 12/2016 | Lee et al. |
| 2017/0062544 A1* | 3/2017 | Kang ................ G09G 3/3225 |
| 2017/0162637 A1 | 6/2017 | Choi et al. |
| 2017/0294502 A1 | 10/2017 | Ka et al. |
| 2017/0301280 A1 | 10/2017 | Ka et al. |
| 2020/0013834 A1 | 1/2020 | Park et al. |

FOREIGN PATENT DOCUMENTS

| | | |
|---|---|---|
| JP | 2018-087863 | 6/2018 |
| KR | 10-2016-0147116 | 12/2016 |
| KR | 10-2017-0064598 | 6/2017 |
| KR | 10-2017-0066767 | 6/2017 |
| KR | 10-2017-0115177 | 10/2017 |
| KR | 10-2017-0119270 | 10/2017 |

\* cited by examiner

DISPLAY DEVICE

CROSS-REFERENCE TO RELATED APPLICATIONS

This application is a continuation application of U.S. patent application Ser. No. 16/376,608 filed Apr. 5, 2019, which claims priority under 35 U.S.C. § 119 to Korean Patent Application No. 10-2018-0078935, filed on Jul. 6, 2018 in the Korean Intellectual Property Office, the disclosures of which are incorporated by reference herein in their entirety.

TECHNICAL FIELD

Exemplary embodiments relate to a display device, and more particularly, to a display device that provides different display area shapes and improves display quality.

DISCUSSION OF THE RELATED ART

As display devices become thinner and lighter, their use cases have expanded. For example, display devices having various shapes are being used for devices such as monitors, mobile phones, clocks, etc. Display quality may deteriorate as a result of implementing certain changes when designing a display device to have a particular shape.

SUMMARY

Exemplary embodiments include a display device that diversifies a shape of a display area and simultaneously improves display quality.

According to an exemplary embodiment, a display device includes a substrate, a first insulating layer disposed on the substrate, a through portion passing through the substrate and the first insulating layer, a display unit disposed on the first insulating layer and including a plurality of pixels surrounding at least a portion of the through portion, and a dummy pixel unit. Each pixel includes a light-emitting element including a pixel electrode and an opposite electrode facing each other, and an emission layer disposed between the pixel electrode and the opposite electrode. The dummy pixel unit includes a plurality of dummy pixels disposed between the through portion and the display unit, and including a metal pattern including a same material as the pixel electrode. The dummy pixels are disposed adjacent to the display unit In an exemplary embodiment, the dummy pixels of the dummy pixel unit are disposed successive with the pixels of the display unit.

In an exemplary embodiment, the display device further includes a first pixel circuit and a second pixel circuit. Each of the first pixel circuit and the second pixel circuit includes a thin film transistor disposed on the substrate. A first pixel from among the plurality of pixels is electrically connected to the first pixel circuit, and a first dummy pixel from among the plurality of dummy pixels is electrically insulated from the second pixel circuit.

In an exemplary embodiment, the display device further includes a via layer covering the first pixel circuit and the second pixel circuit. The via layer planarizes a top surface of the via layer, and includes a contact hole that electrically connects the first pixel to the first pixel circuit. The contact hole is not disposed between the second pixel circuit and the metal pattern.

In an exemplary embodiment, the pixel electrode is electrically connected to the thin film transistor of the first pixel circuit, and the metal pattern is electrically insulated from the thin film transistor of the second pixel circuit.

In an exemplary embodiment, the display device further includes a second insulating layer covering an edge of the pixel electrode. The second insulating layer exposes a portion of the pixel electrode and covers a top surface of the metal pattern.

In an exemplary embodiment, the display device further includes an organic pattern disposed on the second insulating layer in an area corresponding to the metal pattern. The organic pattern includes a same material as the emission layer.

In an exemplary embodiment, the metal pattern and the organic pattern are spaced apart from each other, and the second insulating layer is disposed between the metal pattern and the organic pattern.

In an exemplary embodiment, the display device further includes a second insulating layer including a first opening and a second opening. The first opening covers an edge of the pixel electrode and exposes a portion of the pixel electrode, and the second opening covers an edge of the metal pattern and exposes a portion of the metal pattern. The portion of the metal pattern exposed through the second opening contacts the opposite electrode.

In an exemplary embodiment, the emission layer is disposed on the portion of the pixel electrode exposed through the first opening, and is not disposed on a remaining portion of the pixel electrode.

In an exemplary embodiment, the display device further includes a groove disposed in the first insulating layer between the through portion and the dummy pixel unit.

In an exemplary embodiment, the display device further includes a cladding layer disposed on the first insulating layer. The cladding layer covers the groove and includes a different material than the first insulating layer.

In an exemplary embodiment, a depth of the groove is about equal to or less than a thickness of the first insulating layer.

In an exemplary embodiment, the display device further includes a wiring connection unit disposed between the groove and the dummy pixel unit.

In an exemplary embodiment, the display device further includes a spaced area disposed between the wiring connection unit and the dummy pixel unit.

In an exemplary embodiment, the display device further includes a metal layer having a ring shape. The metal layer is disposed over the spaced area and surrounds the through portion, and a diameter of the metal layer is greater than a diameter of the through portion.

In an exemplary embodiment, the substrate includes a display area in which the display unit is disposed, and a non-display area disposed adjacent to the display area. The non-display area includes a first non-display area surrounding at least a portion of an outer edge of the display area including an edge of the substrate, and a second non-display area surrounding at least a portion of an outer edge of the through portion between the through portion and the display area.

In an exemplary embodiment, the through portion is disposed adjacent to the edge of the substrate, and the first non-display area is connected to the second non-display area.

In an exemplary embodiment, the through portion includes a first through hole, and a second through hole disposed adjacent to the first through hole. At least a portion of the dummy pixel unit is disposed between the first through hole and the second through hole.

In an exemplary embodiment, the through portion includes a single closed curve.

In an exemplary embodiment, the groove passes through the first insulating layer and extends to at least a portion of the substrate.

According to an exemplary embodiment, a display device includes a substrate, a first insulating layer disposed on the substrate, a through portion passing through the substrate and the first insulating layer, a second insulating layer disposed on the first insulating layer, a plurality of pixels surrounding at least a portion of the through portion, and a plurality of dummy pixels disposed between the through portion and the plurality of pixels. Each pixel of the plurality of pixels includes a light-emitting element including a pixel electrode and an opposite electrode facing each other, and an emission layer disposed between the pixel electrode and the opposite electrode. Each dummy pixel of the plurality of dummy pixels includes a metal pattern including a same material as the pixel electrode. The second insulating layer includes a plurality of openings that exposes every pixel electrode of the plurality of pixels, and the second insulating layer completely covers every metal pattern of the plurality of dummy pixels.

BRIEF DESCRIPTION OF THE DRAWINGS

The above and other features of the present disclosure will become more apparent by describing in detail exemplary embodiments thereof with reference to the accompanying drawings, in which.

DETAILED DESCRIPTION

Figure 1:
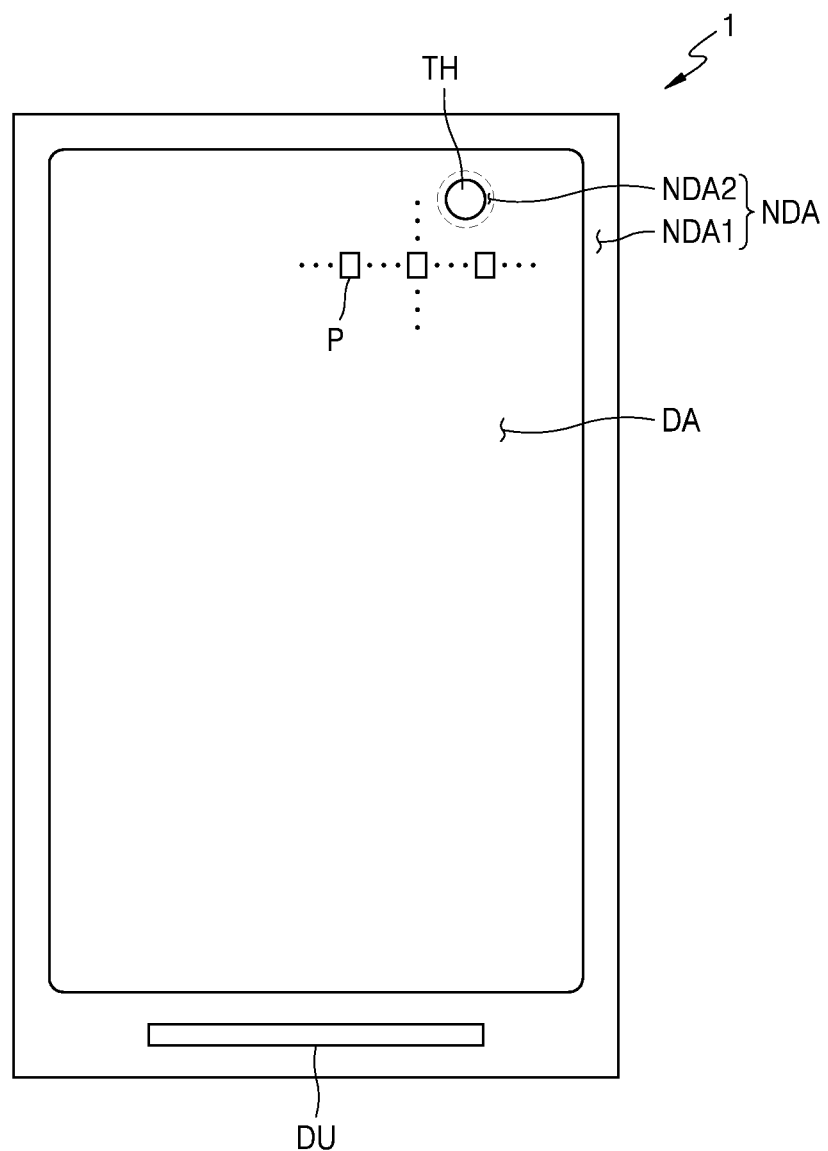
FIG. 1 is a plan view of a display device according to an exemplary embodiment.

Exemplary embodiments of the present disclosure will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

As used herein, the singular forms "a", "an" and "the" are intended to include the plural forms as well, unless the context clearly indicates otherwise.

It will be understood that when a layer, region, or component is referred to as being "formed on" another layer, region, or component, it can be directly or indirectly formed on the other layer, region, or component. That is, for example, intervening layers, regions, or components may be present.

When a certain exemplary embodiment may be implemented differently, a specific process order may be performed differently from the described order. For example, two consecutively described processes may be performed substantially at the same time or performed in an order opposite to the described order.

Exemplary embodiments may prevent a display device component such as, for example, a wiring that is disposed outside of a display area from being viewed due to external light. Exemplary embodiments further allow for the implementation of a display device that provides different display area shapes and improves display quality.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component.

Figure 2:
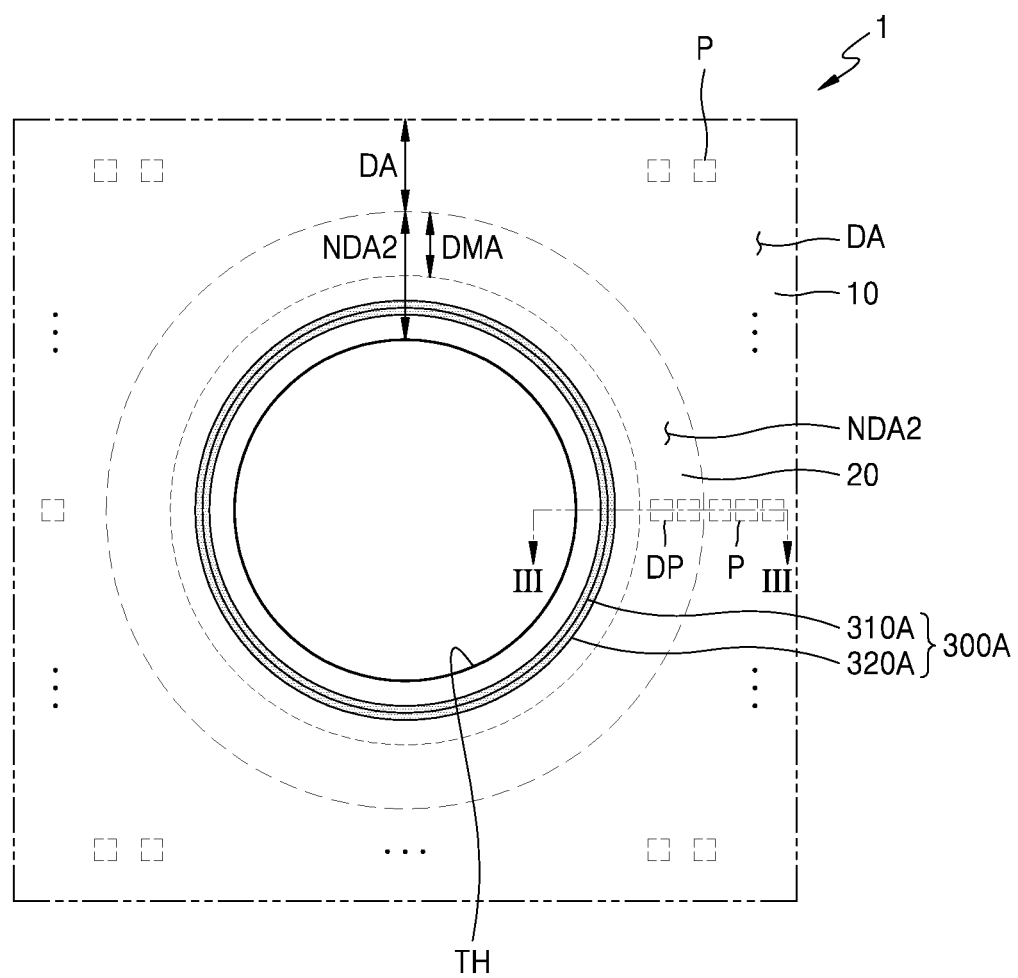
FIG. 2 is an enlarged plan view of a through portion in a display area of FIG. 1 according to an exemplary embodiment.
Figure 3:
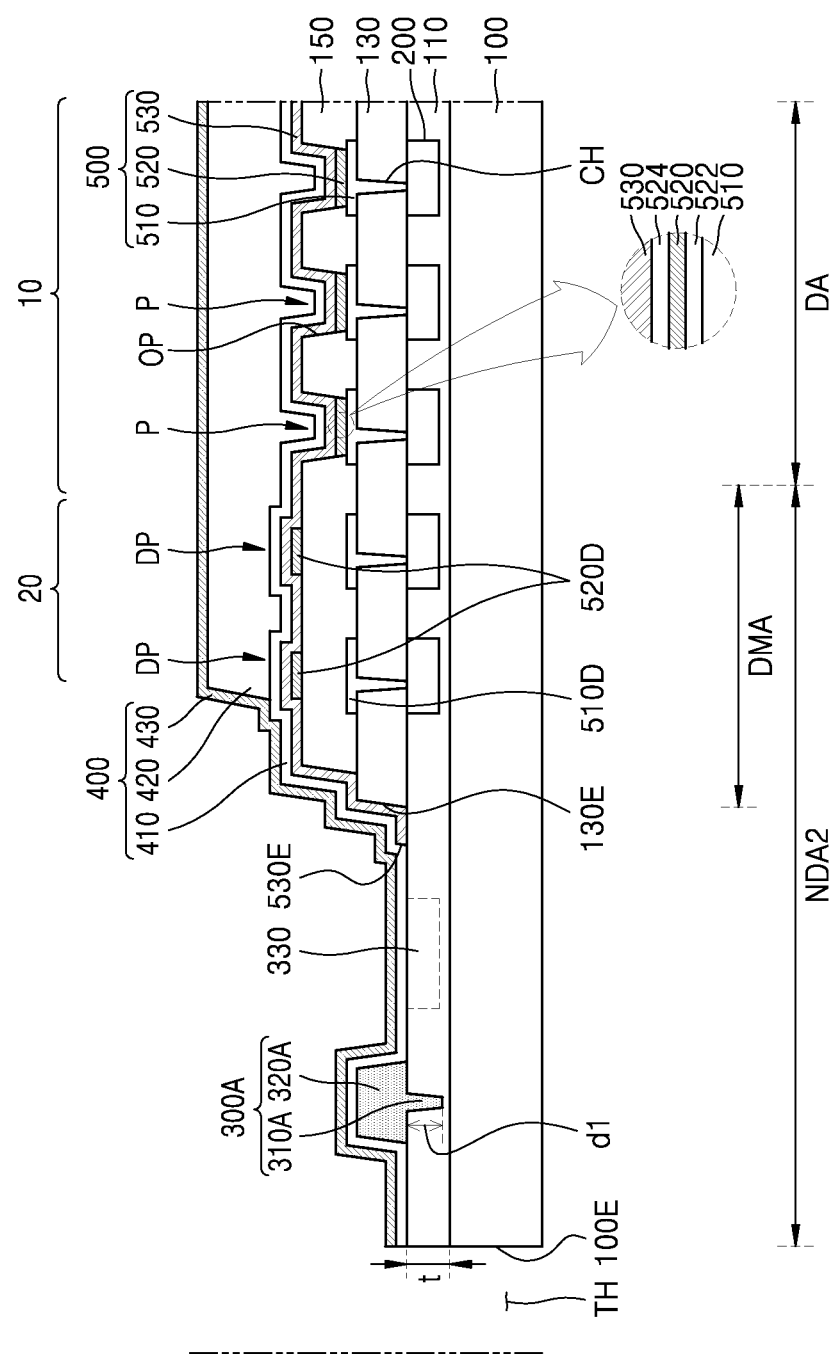
FIG. 3 is a cross-sectional view taken along line III-III of FIG. 2 according to an exemplary embodiment.

FIG. 1 is a plan view of a display device 1 according to an exemplary embodiment. FIG. 2 is an enlarged plan view of a through portion TH in the display area DA of FIG. 1. FIG. 3 is a cross-sectional view taken along line III-III of FIG. 2.

Referring to FIGS. 1 to 3, the display device 1 includes a substrate 100 and a display unit 10 disposed on the substrate 100.

The substrate 100 may include a material such as, for example, glass, metal, or an organic material. According to an exemplary embodiment, the substrate 100 may include a flexible material. For example, the substrate 100 may include a material that may be warped as desired, and that is bendable or rollable, such as, for example, polyimide (PI). However, exemplary embodiments of the present disclosure are not limited thereto.

The substrate 100 includes a display area DA and a non-display area NDA. A through portion TH is disposed in the display area DA. The through portion TH is a hole that passes through the substrate 100 and various layers disposed on the substrate 100, and is disposed inside the display area DA and is surrounded by the display unit 10, which includes a plurality of pixels P.

Each pixel P of the display unit 10 includes a pixel circuit and a light-emitting element such as, for example, an organic light-emitting diode (OLED) electrically connected to the pixel circuit. Each pixel P provides a predetermined image through light emitted from the light-emitting element. The display unit 10 is sealed by an encapsulation layer described below. The encapsulation layer may be, for example, a multi-layer including a layer including an organic material and a layer including an inorganic material.

The non-display area NDA is an area that does not provide an image, and includes a first non-display area NDA1 surrounding an outer edge of the display area DA along an edge of the substrate 100, and a second non-display area NDA2 surrounding an outer edge of the through portion TH.

A driving unit DU such as a scan driver and a data driver configured to transfer a preset signal to each pixel P of the display area DA may be disposed in the first non-display area NDA1. The second non-display area NDA2 is disposed between the through portion TH and the display area DA. A wiring routing unit to which pixels P adjacent to the second non-display area NDA2 are connected may be disposed in the second non-display area NDA2.

Although it is shown that the through portion TH is disposed in a right upper end of the display area DA in the display device 1 of FIG. 1, exemplary embodiments of the present disclosure are not limited thereto. For example, according to exemplary embodiments, the through portion TH may be disposed anywhere in the display area DA.

Also, although it is shown that the through portion TH is circular and that one through portion TH is provided in the display device of FIG. 1, exemplary embodiments of the present disclosure are not limited thereto. For example, according to exemplary embodiments, the through portion TH may have various shapes such as a polygon or an elliptical shape, and one or more through portions TH may be provided (see, e.g., FIGS. 12 and 13).

Also, although it is shown that the display area DA is a quadrangle in the display device of FIG. 1, exemplary embodiments of the present disclosure are not limited thereto. For example, the display area DA may be a polygon instead of a quadrangle, or may have various shapes such as a circular shape and an elliptical shape.

Referring to FIGS. 2 and 3, the through portion TH is disposed inside the display unit 10. As a result, the through portion TH is surrounded by pixels P. A region in which a pixel P is not provided, that is, the second non-display area NDA2, is disposed between the through portion TH and the pixels P.

The through portion TH passes through the substrate 100, an encapsulation layer 400, and layers disposed therebetween. The through portion TH may be formed by cutting/punching equipment using a laser, etc. A crack may occur in the vicinity of the through portion TH due to an impact during a process of forming the through portion TH by using the cutting equipment. Thus, in an exemplary embodiment, a crack prevention pattern 300A is disposed in the second non-display area NDA2. The crack prevention pattern 300A may prevent the crack from propagating toward a pixel P.

The crack prevention pattern 300A includes a groove 310A and a cladding layer 320A covering the groove 310A.

The groove 310A has a ring shape having a radius greater than a radius of the through portion TH, and surrounds an outer edge of the through portion TH, as illustrated in FIG. 2. Although it is shown that the through portion TH is circular and the groove 310A has a circular ring shape, exemplary embodiments of the present disclosure are not limited thereto. For example, in an exemplary embodiment, the groove 310A may have a polygonal ring shape such as a triangular ring shape and a quadrangular ring shape, or an elliptical ring shape.

The groove 310A is a recess that is concave in a thickness direction of a first insulating layer 110 disposed on the substrate 100, and may block a crack from propagating toward the display area DA. For example, the groove 310A may be formed in the first insulating layer 110 and may be concave in a direction toward the substrate 100. The groove 310A may have a depth dl that is about equal to or less than a thickness t of the first insulating layer 110. In an exemplary embodiment, the depth dl may range from about 6000 Å to about 8000 Å.

The first insulating layer 110 including the groove 310A is an inorganic layer, and may be a single inorganic layer including the first insulating layer 110 or a plurality of inorganic layers including a plurality of layers. For example, the first insulating layer 110 may include an inorganic material such as silicon oxide, silicon nitride, and silicon oxynitride.

The cladding layer 320A overlaps the groove 310A and covers the groove 310A. The cladding layer 320A may be disposed directly on the first insulating layer 110 such that the cladding layer 320A directly contacts the groove 310A. A portion of the cladding layer 320A may be disposed inside the groove 310A.

The cladding layer 320A may include an organic insulating material. For example, the cladding layer 320A may include the same material as a via layer 130 and/or a second insulating layer 150.

A top surface of the cladding layer 320A may be relatively flat, and the cladding layer 320A may cover the groove 310A. In an exemplary embodiment, a total thickness of the cladding layer 320A (e.g., a thickness from a bottom surface to a top surface of the cladding layer 320A filling the groove 310A) may range from about 7000 Å to about 150000 Å. However, exemplary embodiments of the present disclosure are not limited thereto.

The cladding layer 320A may reduce stress of a portion of the first insulating layer 110, which is an inorganic layer, in which the groove 310A has been formed, and may prevent a crack from propagating. Also, the cladding layer 320A covers the groove 310A and may prevent particles from collecting in the groove 310A during a manufacturing process and moving to a light-emitting element 500 of a pixel P, which may generate a black spot.

A dummy pixel unit 20 is disposed in the second non-display area NDA2. The dummy pixel unit 20 may be disposed between the display area DA and the crack prevention pattern 300A and includes dummy pixels DP. The dummy pixel unit 20 may be disposed in a portion of the second non-display area NDA2 adjacent to the display area DA. An area in which the dummy pixel unit 20 is disposed may be defined as a dummy pixel area DMA.

As illustrated in FIG. 3, the dummy pixel unit 20 is an area extending from the display unit 10 and provided as one body with the display unit 10. The dummy pixel unit 20 is a unit in which a pixel is disposed, but in which the pixel does not actually emit light and is disposed as a dummy. Therefore, dummy pixels DP of the dummy pixel unit 20 are disposed successive with the pixels P of the display unit 10. For example, in an exemplary embodiment, the dummy pixels DP of the dummy pixel unit 20 and the pixels P of the display unit 10 are aligned with one another.

In an exemplary embodiment, about one to three pixels may be provided as dummy pixels DP. However, exemplary embodiments of the present disclosure are not limited thereto. For example, the number of dummy pixels DP may be varied by taking different factors into account such as, for example, a size of the through portion TH, a shape of the through portion TH, a width of a dead space, etc.

As a comparative example, if pixels P that normally emit light (e.g., not dummy pixels DP) are disposed in the dummy pixel unit 20, when the through portion TH is formed by cutting/punching equipment using a laser, etc., some of the pixels P disposed in the vicinity of the through portion TH may be damaged. Also, a characteristic of a pixel circuit is changed by an arrangement change of the pixels P neighboring the through portion TH due to the through portion TH, which causes a parasitic capacitance difference between the pixels P neighboring the through portion TH and the pixels P that do not neighbor the through portion. As a result, in the comparative example, a stain of the pixels P neighboring the through portion TH may be generated, and reliability of the display unit may be reduced.

A wiring connection unit 330 is disposed between the crack prevention pattern 300A and the dummy pixel unit 20 in the display unit 10. The wiring connection unit 330 includes wirings configured to supply a signal to the pixels P disposed in the vicinity of the through portion TH, may be a scan signal wiring or a data signal wiring, and is designed to bypass the through portion TH.

Since the through portion TH is disposed inside the display area DA, design of the pixels P neighboring the through portion TH and the wirings configured to supply a signal to the pixels P is changed, which causes a deviation in a parasitic capacitance between the pixels P, and consequently causes a stain of the pixels P neighboring the through portion TH.

Therefore, the display device 1 according to an exemplary embodiment may remove a stain defect of the pixels neighboring the through portion TH, and may improve the quality of the display unit 10 by configuring the pixels P disposed in the vicinity of the through portion TH by using the dummy pixels DP that do not emit light.

Referring to the display area DA of FIG. 3, a pixel circuit 200 and a light-emitting element 500 are disposed in the display area DA.

The light-emitting element 500 includes a pixel electrode 510 electrically connected to the pixel circuit 200 with the via layer 130 including a contact hole CH disposed therebetween, an opposite electrode 530 facing the pixel electrode 510, and an emission layer 520 disposed therebetween. In an exemplary embodiment, the via layer 130 may include an insulating organic material.

The pixel electrode 510 is exposed through an opening OP provided in the second insulating layer 150, and an edge of the pixel electrode 510 may be covered by the second insulating layer 150 including an insulating organic material. In an exemplary embodiment, the pixel electrode 510 may include, for example, Ag, Mg, Al, Pt, Pd, Au, Ni, Nd, Jr, Cr, or a compound thereof. The second insulating layer 150 is a pixel-defining layer. In an exemplary embodiment, the second insulating layer 150 covers an edge of the pixel electrode 510, and exposes a central portion of the pixel electrode 510.

The opposite electrode 530 may be provided as one body and may completely cover the display area DA. In an exemplary embodiment, the opposite electrode 530 may be, for example, a thin film metal layer including Ag and Mg, or a transparent conductive oxide (TCO) such as indium tin oxide (ITO), indium zinc oxide (IZO), zinc oxide (ZnO), indium oxide ($In_2O_3$), indium gallium oxide (IGO), or aluminum zinc oxide (AZO).

Figure 4:
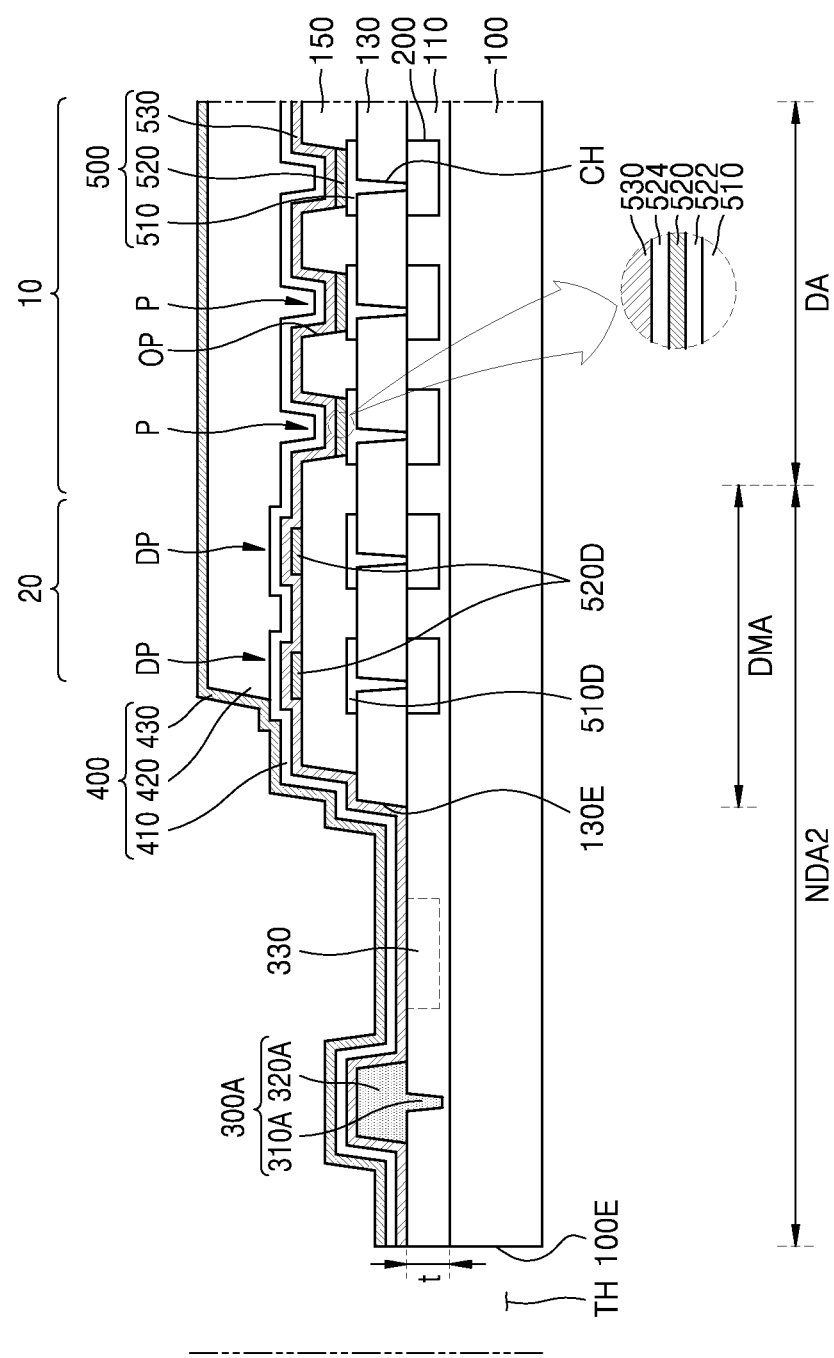
FIG. 4 is a cross-sectional view of a display device according to an exemplary embodiment.

In an exemplary embodiment, an end 530E of the opposite electrode 530 may cover an end 130E of the via layer 130 and may be disposed between the via layer 130 and the wiring connection unit 330, as illustrated in FIG. 3. In an exemplary embodiment, the end 530E of the opposite electrode 530 may extend to an edge 100E of the substrate 100 in which the through portion TH has been formed, as illustrated in FIG. 4. A structure of the opposite electrode 530 shown in FIG. 4 is applicable to other exemplary embodiments described herein.

The emission layer 520 may include an organic material including a fluorescence or phosphorescence material that emits red, green, or blue light, and may be patterned to correspond to the pixels P of the display area DA. At least one of a first functional layer 522 disposed between the emission layer 520 and the pixel electrode 510, and a second functional layer 524 disposed between the emission layer 520 and the opposite electrode 530, may be provided. Unlike the emission layer 520 patterned over the pixel electrode 510, the first functional layer 522 and the second functional layer 524 may be common layers provided on the entire surface of the display unit 10.

The first functional layer 522 may include at least one of, for example, a hole injection layer (HIL) and a hole transport layer (HTL). The HIL allows holes to be emitted from an anode, and the HTL allows holes of the HIL to be transferred to the emission layer 520.

The HIL may include a phthalocyanine compound such as, for example, copper phthalocyanine, DNTPD (N,N'-diphenyl-N,N'-bis-[4-(phenyl-m-tolyl-amino)-phenyl]-biphenyl-4,4'-diamine, m-MTDATA(4,4',4 "-tris(3-methylphenylphenylamino) triphenylamine, TDATA(4,4'4"-Tris (N,N-diphenylamino)triphenylamine, 2T-NATA(4,4',4"-tris{N,-(2-naphthyl)-N-phenylamino}-triphenylamine, PEDOT/PSS (Poly(3,4-ethylenedioxythiophene)/Poly(4-styrenesulfonate), Pani/DBSA(Polyaniline/Dodecylbenzenesulfonic acid), Pani/CSA (Polyaniline/Camphor sulfonicacid), or PANI/PSS (Polyaniline)/Poly(4-styrenesulfonate), and is not limited thereto.

The HTL may include carbazole derivatives such as, for example, N-phenyl carbazole, polyvinyl carbazole, etc., TPD(N,N'-bis(3-methylphenyl)-N,N'-diphenyl-[1,1-biphenyl]-4,4'-diamine, NPB(N,N'-di(1-naphthyl)-N,N'-diphenylbenzidine, and a triphenylamine-based material such as, for example, TCTA(4,4',4"-tris(N-carbazolyl)triphenylamine, and is not limited thereto.

The second functional layer 524 may include at least one of an electron transport layer (ETL) and an electron injection layer (EIL). The EIL allows electrons to be emitted from a cathode, and the ETL allows electrons of the EIL to be transferred to the emission layer 520.

The ETL may include, for example, Alq3, BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3,5-diphenyl-4H-1,2,4-triazole), 4tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato)aluminum), Bebq2 (beryllium bis (benzoquinolin-10-olate)), ADN(9,10-di(naphthalene-2-yl) anthracene, and is not limited thereto.

The EIL may include a material such as, for example, LiF, NaCl, CsF, $Li_2O$, BaO, and Liq, and is not limited thereto.

In an exemplary embodiment, unlike the actual pixel P, an opening OP is not formed in the second insulating layer 150 with respect to the dummy pixel DP.

As described above, in the pixel P of the display unit 10, a central portion of the pixel electrode 510 is exposed through the opening OP of the second insulating layer 150, and the emission layer 520 is disposed on the pixel electrode 510 such that the emission layer 520 is disposed between the pixel electrode 510 and the opposite electrode 530.

In contrast, a dummy pixel DP includes a metal pattern 510D corresponding to the pixel electrode 510 of the pixel P, and the second insulating layer 150 completely covers the metal pattern 510D and does not include the opening OP, unlike the actual pixel P. Therefore, in the dummy pixel DP, the second insulating layer 150 is entirely disposed between the metal pattern 510D and an organic pattern 520D corresponding to the emission layer 520 of the pixel P. Therefore, since the organic pattern 520D of the dummy pixel DP does not directly contact the metal pattern 510D of the dummy pixel DP, the dummy pixel DP does not actually emit light. Rather, when driven, the dummy pixel DP is expressed as a black dead space like the second non-display area NDA2.

Thus, in an exemplary embodiment, the second insulating layer 150 includes a plurality of openings OP that exposes every pixel electrode 510 of the plurality of pixels P, and the second insulating layer 150 does not include any openings in areas corresponding to the dummy pixels DP, and thus, the second insulating layer 150 completely covers every metal pattern 510D of the plurality of dummy pixels DP.

The encapsulation layer 400 is disposed on the pixels P and the dummy pixels DP. However, exemplary embodiments of the present disclosure are not limited thereto. For example, in an exemplary embodiment, instead of the encapsulation layer 400, the display unit 10 is sealed by providing an encapsulation substrate over the substrate 100 and bonding the substrate 100 onto the encapsulation substrate by using a sealant on an outer periphery of the substrate 100. A structure of sealing the display unit 10 by using the encapsulation layer 400 is described herein.

The encapsulation layer 400 includes inorganic encapsulation layers 410 and 430 and an organic encapsulation layer 420. For example, the encapsulation layer 400 may include the inorganic encapsulation layer 410, the organic encapsulation layer 420, and the inorganic encapsulation layer 430 sequentially stacked on one another. The inorganic encapsulation layers 410 and 430 may include at least one of, for example, silicon nitride, aluminum nitride, zirconium nitride, titanium nitride, hafnium nitride, tantalum nitride, silicon oxide, aluminum oxide, titanium oxide, tin oxide, cesium oxide, and silicon oxynitride. The inorganic encapsulation layers 410 and 430 may be formed by chemical vapor deposition (CVD).

The organic encapsulation layer 420 may include at least one of, for example, an acrylic-based resin, a methacrylate-based resin, a polyisoprene vinyl-based resin, an epoxy resin, a urethane-based resin, a cellulose resin, and a perylene-based resin.

In an exemplary embodiment, the organic encapsulation layer 420 may be formed by an atomic layer deposition (ALD) process that uses a material such as, for example, hexamethyldisiloxane (HMDSO) or tetradthly orthosilicate (TEOS) as a material gas.

In an exemplary embodiment, the organic encapsulation layer 420 may be formed by depositing a liquid monomer and then hardening the same using heat or light such as an ultraviolet ray. To prevent the liquid monomer from flowing toward the crack prevention pattern 300A and an edge tail of the organic encapsulation layer 420 from being formed, a dam may be disposed in the second non-display area NDA2. An end of the organic encapsulation layer 420 may be disposed between the dam and the pixel P by the dam.

Although the encapsulation layer 400 in the exemplary embodiment described herein includes the two inorganic encapsulation layers 410 and 430 and the one organic encapsulation layer 420, a stacking sequence and the numbers of inorganic encapsulation layers and organic encapsulation layers are not limited thereto.

Figure 5:
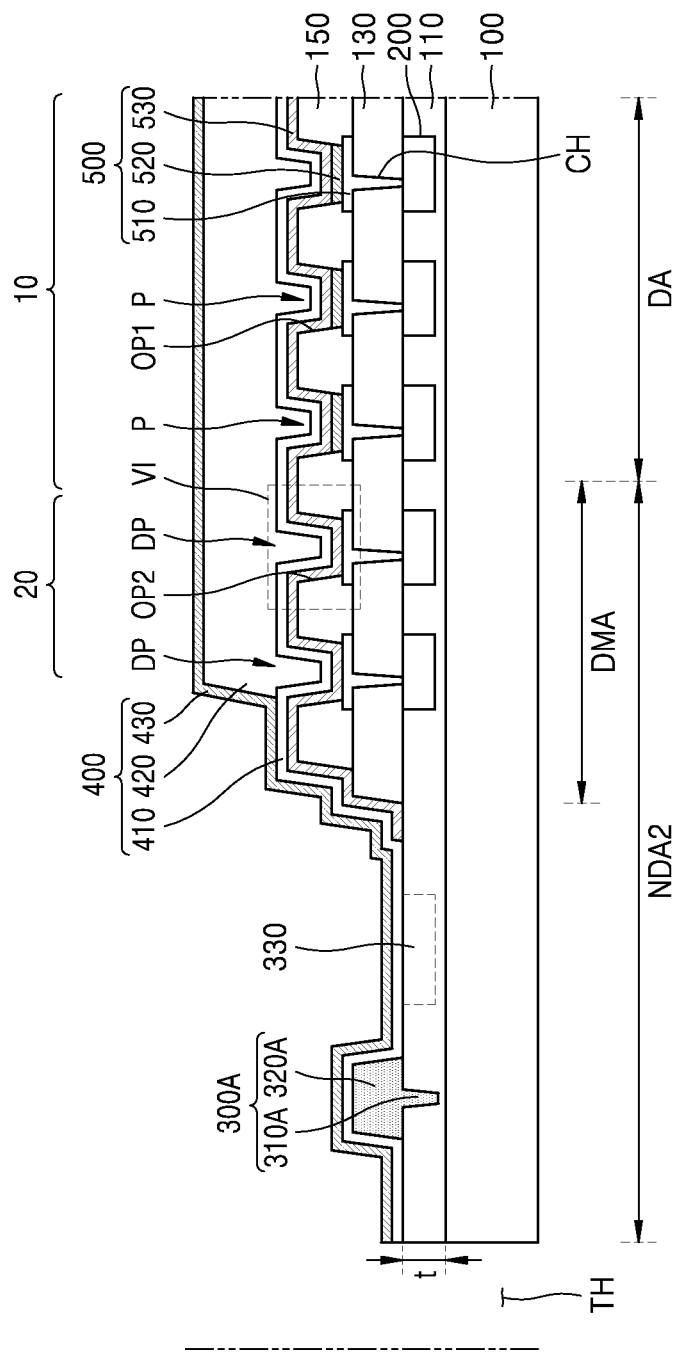
FIG. 5 is a cross-sectional view of a display device according to an exemplary embodiment.
Figure 6:
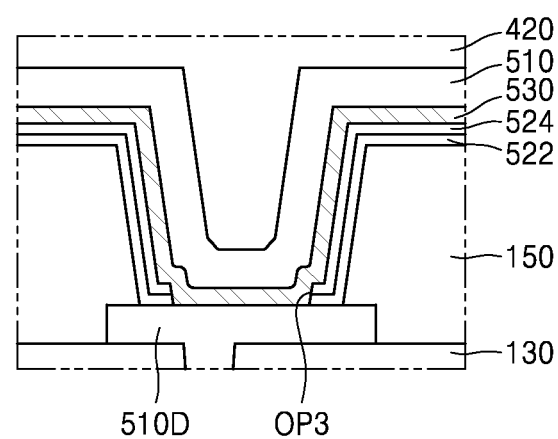
FIG. 6 is an enlarged cross-sectional view of portion VI of FIG. 5 according to an exemplary embodiment.
Figure 7:
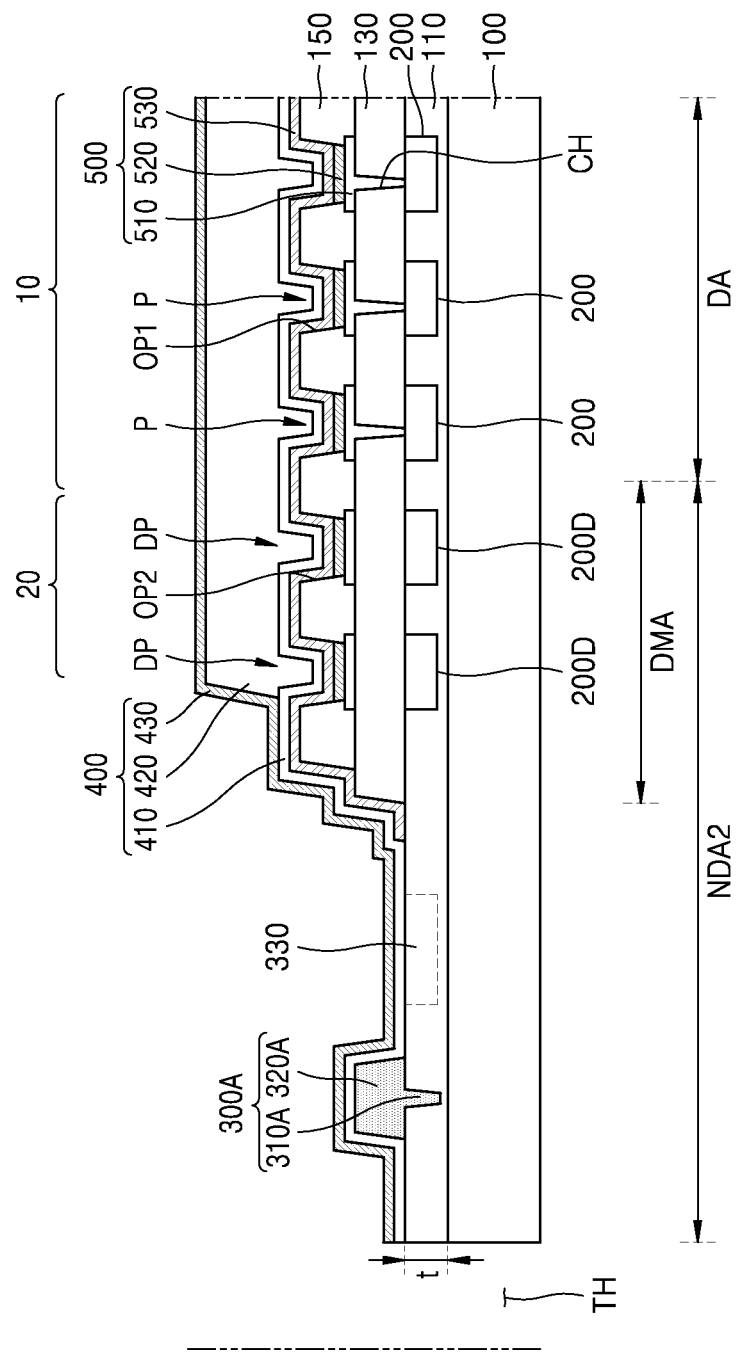
FIG. 7 is a cross-sectional view of a display device according to an exemplary embodiment.

FIGS. 5 to 7 are cross-sectional views of a display device according to an exemplary embodiment.

An exemplary embodiment of FIGS. 5 and 7 is different from the exemplary embodiment of FIG. 3 with relation to a structure of the dummy pixel DP of the dummy pixel unit 20. For convenience of explanation, the difference with relation to the structure of the dummy pixel DP is primarily described, and a further description of components previously described may be omitted.

Unlike FIG. 3, in the dummy pixel DP of FIG. 5, the organic pattern 520D (the emission layer) is not disposed.

In the pixel P of the display unit 10, the second insulating layer 150 includes a first opening OP1 that covers an edge of the pixel electrode 510 and exposes a central portion of the pixel electrode 510, the emission layer 520 is disposed on the pixel electrode 510, and the opposite electrode 530 is disposed on the emission layer 520. In an exemplary embodiment, the emission layer 520 is disposed on the portion of the pixel electrode 510 exposed through the first opening OP1 (e.g., the exposed central portion of the pixel electrode 510), and is not disposed on a remaining portion of the pixel electrode 510. That is, in an exemplary embodiment, the only portion of the pixel electrode 510 that the emission layer 520 is disposed on is the portion of the pixel electrode 510 exposed through the first opening OP1 (e.g., the exposed central portion of the pixel electrode 510).

Similarly, in the dummy pixel DP of the dummy pixel unit 20, the second insulating layer 150 includes a second opening OP2 that covers an edge of the metal pattern 510D and exposes a central portion of the metal pattern 510D. However, in this case, the organic pattern 520D corresponding to the emission layer 520 is not disposed on the metal pattern 510D. Therefore, as shown in FIG. 6, which is an enlarged cross-sectional view of portion VI in FIG. 5, the opposite electrode 530 may directly contact a top surface of the metal pattern 510D.

Referring to FIG. 6, an opening OP3 that exposes the top surface of the metal pattern 510D may be formed in the first and second functional layers 522 and 524. The organic pattern may be formed on the metal pattern 510D during a manufacturing process and simultaneously removed during a process of forming the opening OP3. At least a portion of the opposite electrode 530 may directly contact the top surface of the metal pattern 510D through the opening OP3 formed in the first and second functional layers 522 and 524.

Referring to FIG. 7, in an exemplary embodiment, a structure of the dummy pixel DP may be formed to be the same as that of the pixel P. In this case, the light-emitting element 500 of the pixel P includes the pixel electrode 510, the emission layer 520, and the opposite electrode 530.

Similarly, the dummy pixel DP includes the metal pattern 510D, the organic pattern 520D, and the opposite electrode 530.

However, in the exemplary embodiment of FIG. 7, the dummy pixel DP is not electrically connected to a second pixel circuit 200D disposed therebelow. The second pixel circuit 200D may be the same circuit element as the first pixel circuit 200 disposed in the display unit 10.

In the pixel P of the display unit 10, the pixel electrode 510 is electrically connected to the first pixel circuit 200 disposed therebelow through a contact hole CH formed in the via layer 130. The pixel electrode 510 being electrically connected to the first pixel circuit 200 may mean that the pixel electrode 510 is electrically connected to a source electrode or a drain electrode of a thin film transistor of the first pixel circuit 200.

In the dummy pixel DP of the dummy pixel unit 20, the second pixel circuit 200D is disposed below the metal pattern 510D, but the metal pattern 510D is electrically insulated from the second pixel circuit 200D. For example, in an exemplary embodiment, the contact hole CH is not disposed between the second pixel circuit 200D and the metal pattern 510D, and as a result, the metal pattern 510D is not connected to the second pixel circuit 200D.

That is, in an exemplary embodiment, a contact hole is not formed in a portion of the via layer 130 on which the metal pattern 510D is disposed, and therefore, the dummy pixel DP is not electrically connected to the second pixel circuit 200D. In an exemplary embodiment, the pixel circuit 200 is not disposed below the dummy pixel DP.

Figure 8:
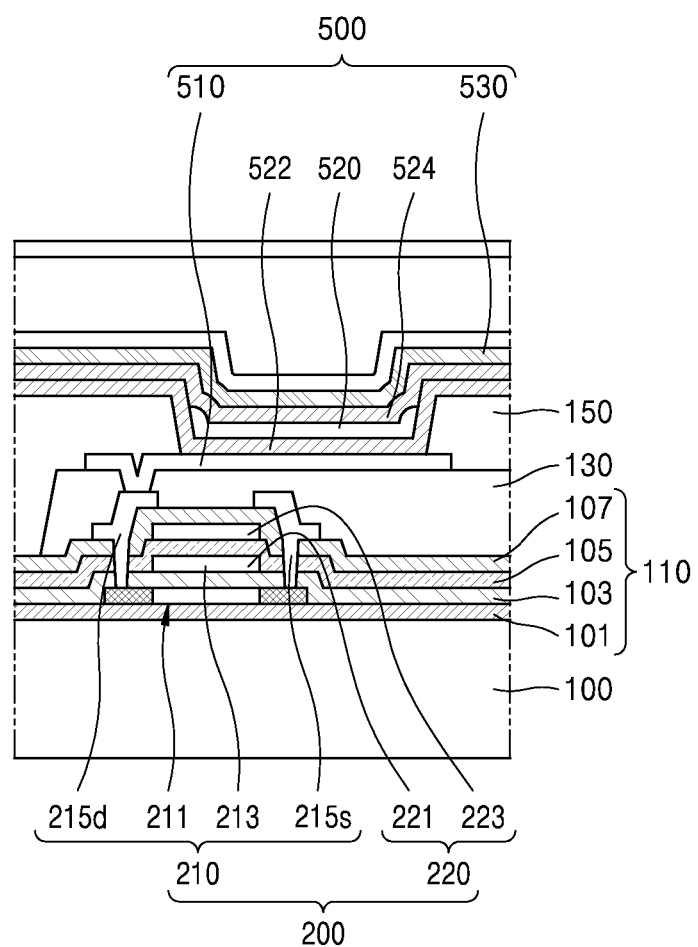
FIGS. 8 and 9 are enlarged cross-sectional views of a pixel structure of FIG. 1 according to an exemplary embodiment.
Figure 9:
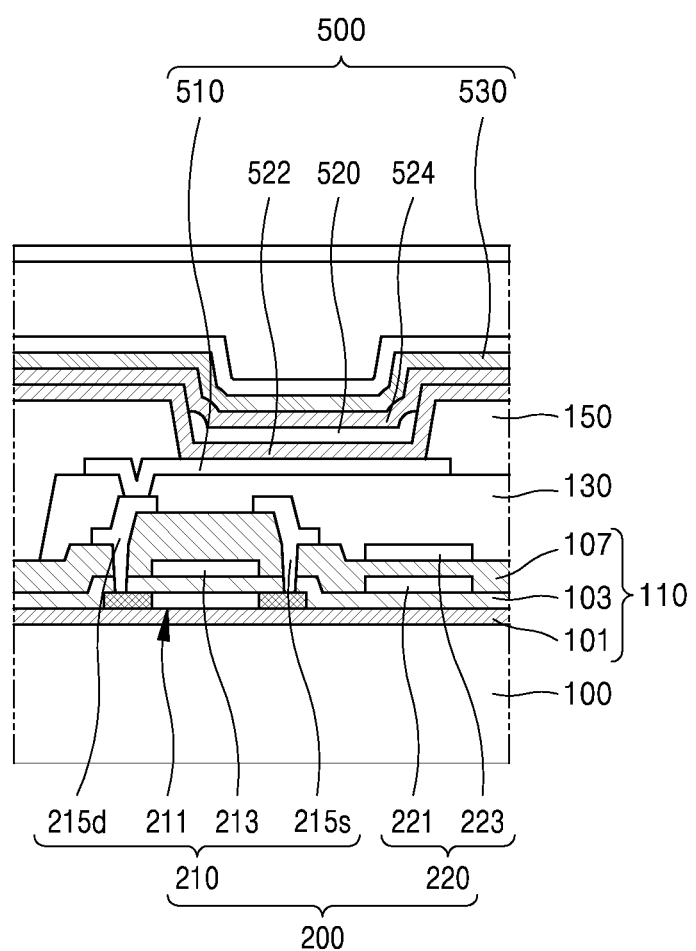

FIGS. 8 and 9 are enlarged cross-sectional views of a pixel structure of FIG. 1 according to an exemplary embodiment.

FIGS. 8 and 9 are cross-sectional views of a portion of the pixel P in the display area DA of a display device according to an exemplary embodiment. For convenience of explanation, since the display device of FIGS. 8 and 9 includes the same configuration as that of the display device described with reference to FIG. 3, the pixel circuit 200 is primarily described below, and a further description of components previously described may be omitted.

Referring to FIG. 8, in an exemplary embodiment, the pixel circuit 200 includes a thin film transistor 210 and a storage capacitor 220. The first insulating layer 110 may include a buffer layer 101, a gate insulating layer 103, a dielectric insulating layer 105, and an interlayer insulating layer 107 sequentially disposed on the substrate 100.

The buffer layer 101 may prevent penetration of impurities. The gate insulating layer 103 is disposed between a semiconductor layer 211 and a gate electrode 213 of the thin film transistor 210. The dielectric insulating layer 105 is disposed between a bottom electrode 221 and a top electrode 223 of the storage capacitor 220. The interlayer insulating layer 107 is disposed between the gate electrode 213, a source electrode 215s, and a drain electrode 215d of the thin film transistor 210.

All of the buffer layer 101, the gate insulating layer 103, the dielectric insulating layer 105, and the interlayer insulating layer 107 may include an insulating inorganic material. For example, each of the buffer layer 101, the gate insulating layer 103, the dielectric insulating layer 105, and the interlayer insulating layer 107 may include silicon nitride, silicon oxide, and/or silicon oxynitride.

Although the exemplary embodiment of FIG. 8 illustrates that the thin film transistor 210 overlaps the storage capacitor 220, and thus, the gate electrode 213 of the thin film transistor 210 serves as the bottom electrode 221 of the storage capacitor 220, exemplary embodiments of the present disclosure are not limited thereto.

Referring to FIG. 9, the thin film transistor 210 and the storage capacitor 220 of the pixel circuit 200 may be disposed at different locations.

Depending on a structure of the pixel circuit 200, the first insulating layer 110 may include the buffer layer 101, the gate insulating layer 103, and the interlayer insulating layer 107 sequentially disposed on the substrate 100. As illustrated in FIG. 9, the interlayer insulating layer 107 may be disposed between the bottom electrode 221 and the top electrode 223 of the storage capacitor 220 to perform a function of a dielectric.

Although it has been described that the thin film transistor 210 of the pixel circuit 200 is a top-gate type transistor in FIGS. 8 and 9, exemplary embodiments are not limited thereto. For example, in an exemplary embodiment, the thin film transistor 210 may be a bottom-gate type transistor. Also, although a case has been described in which the bottom electrode 221 and the top electrode 223 of the storage capacitor 220 are disposed on the same layers and respectively include the same materials as the gate electrode 213, and the source electrode 215s and the drain electrode 215d in FIG. 8, exemplary embodiments are not limited thereto and may be modified variously.

Figure 10:
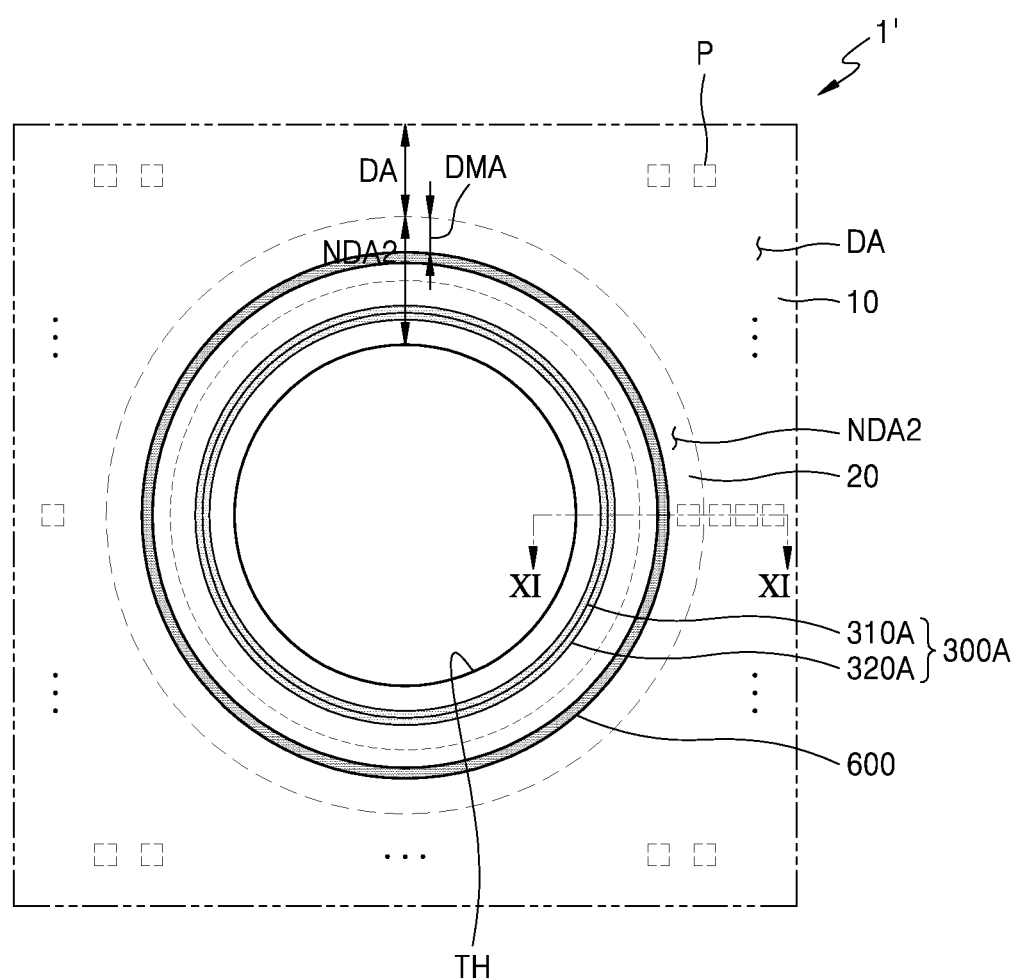
FIG. 10 is an enlarged plan view of a through portion in a display area of a display device according to an exemplary embodiment.
Figure 11:
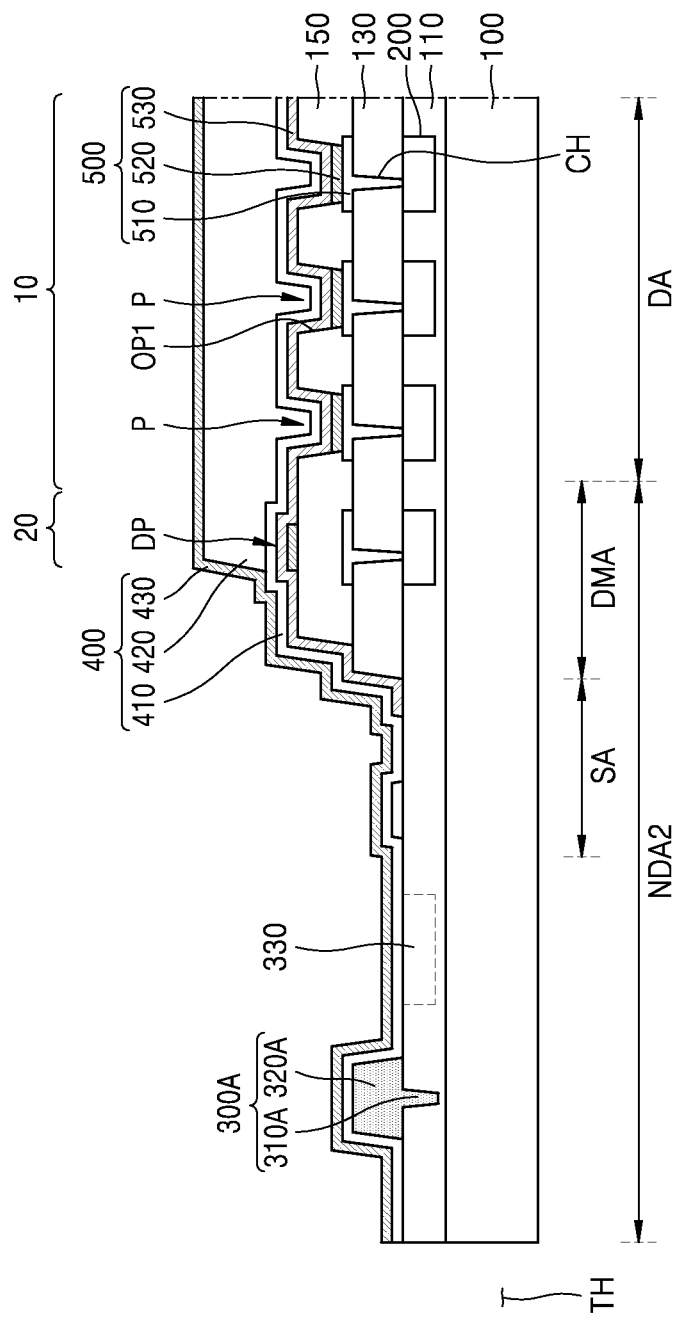
FIG. 11 is a cross-sectional view taken along line XI-XI of FIG. 10 according to an exemplary embodiment.

FIG. 10 is an enlarged plan view of a through portion in a display area of a display device according to an exemplary embodiment. FIG. 11 is a cross-sectional view taken along line XI-XI of FIG. 10 according to an exemplary embodiment.

An exemplary embodiment of FIGS. 10 and 11 further includes a metal layer 600 disposed between the wiring connection unit 330 and the dummy pixel unit 20. The metal layer 600 may be disposed over a spaced area SA between the wiring connection unit 330 and the dummy pixel unit 20.

The metal layer 600 may surround areas that surround the through portion TH, and may have a ring shape that has a greater diameter than the through portion TH, as shown in FIG. 10. However, the shape of the metal layer 600 is not limited thereto, and may be modified depending on the shape of the through portion TH and may be designed separately from the shape of the through portion TH.

Referring to FIG. 11, in an exemplary embodiment the metal layer 600 may include the same material as that of the pixel electrode 510. In an exemplary embodiment, the metal layer 600 may include the same material as that of other conductive layers included in the pixel circuit 200. For example, in the structure of the pixel circuit 200, the metal layer 600 may include the same material as that of the gate electrode 213 of the thin film transistor 210 or the top electrode 223 of the storage capacitor 220, and may include the same material as that of the source electrode 215s and the drain electrode 215d of the thin film transistor 210. For example, in the structure of the pixel circuit 200 of FIG. 8, the metal layer 600 may include the same material as that of the gate electrode 213, or the source electrode 215s and the drain electrode 215d of the thin film transistor 210.

The metal layer 600 may physically separate the wiring connection unit 330 from adjacent pixels P and may simultaneously prevent coupling.

In a display device according to an exemplary embodiment, a dummy pixel area DMA is implemented in an approximately circular shape and surrounds the neighboring area of the through portion TH. However, exemplary embodiments are not limited thereto. For example, according to exemplary embodiments, the dummy pixel area DMA may be implemented in various shapes such as an elliptical shape, a straight line shape, and a U-shape.

Figure 12:
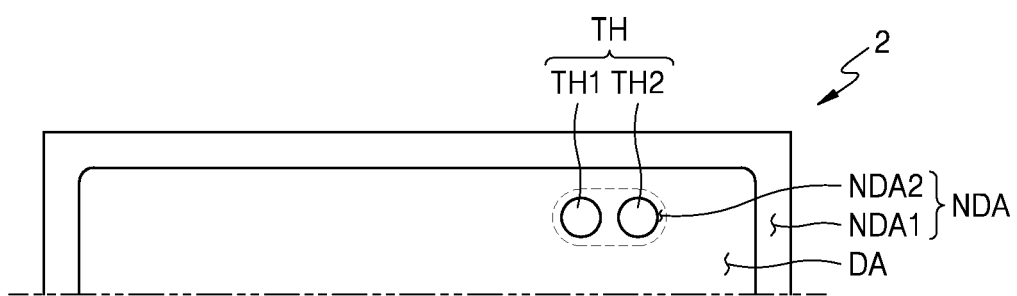
FIG. 12 is a plan view of a display device according to an exemplary embodiment.
Figure 13:
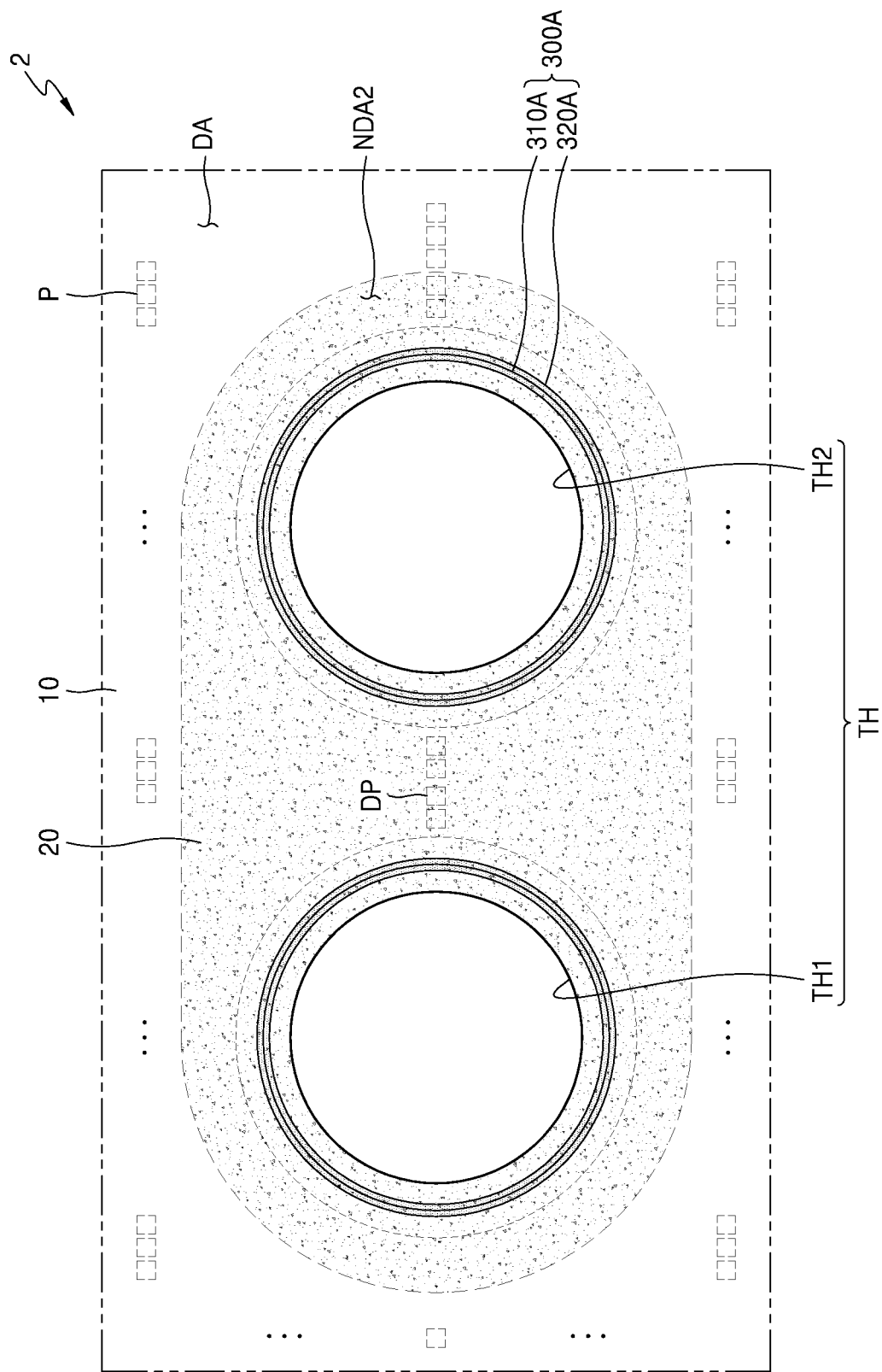
FIG. 13 is an enlarged plan view of a through portion in a display area of FIG. 12 according to an exemplary embodiment.

FIG. 12 is a plan view of a display device 2 according to an exemplary embodiment. FIG. 13 is an enlarged plan view of the through portion TH in the display area DA of FIG. 12 according to an exemplary embodiment.

FIGS. 12 and 13 are different from the above-described exemplary embodiments in terms of the through portion TH and a shape of the second non-display area NDA2 in the neighboring area of the through portion TH. For convenience of explanation, since the configuration otherwise is similar to that of the above-described exemplary embodiments, the through portion TH and the second non-display area NDA2 are primarily described below, and a further description of components previously described may be omitted.

Referring to FIG. 12, in an exemplary embodiment, the display device 2 may include two or more through portions, for example, first and second through portions TH1 and TH2, disposed inside the display area DA. The through portion TH may include the first through portion TH1 and the second through portion TH2. The second non-display area NDA2 is disposed around the through portion TH such that it surrounds the through portion TH.

Referring to FIG. 13, in an exemplary embodiment, the through portion TH is disposed inside the display area DA. The through portion TH includes the first through portion TH1 and the second through portion TH2. Although the through portion TH includes the two through portions TH1 and TH2 in the exemplary embodiment described herein, exemplary embodiments are not limited thereto.

Similar to the above-described exemplary embodiments, the crack prevention pattern 300A may be disposed around the through portion TH such that it surrounds the first through portion TH1 and the second through portion TH2. The wiring connection unit 330 may be disposed outside of the crack prevention pattern 300A.

The dummy pixel unit 20 including the dummy pixels DP is disposed around the through portion TH. At least one of the exemplary embodiments of FIGS. 3 to 6 is applicable referring to the structures of the dummy pixels DP. The dummy pixel unit 20 is disposed between the wiring connection unit 330 and the display unit 10.

The dummy pixels DP may be disposed in the second non-display area NDA2 disposed around the through portion TH. The dummy pixels DP surround areas surrounding the first through portion TH1 and the second through portion TH2. For example, in an exemplary embodiment, the dummy pixels DP may also be disposed in a region between the first through portion TH1 and the second through portion TH2. Since the dummy pixels DP are recognized as a dead space that does not emit light, visibility may be implemented as if the first through portion TH1 were connected to the second through portion TH2 by arranging the dummy pixels DP in the region between the first through portion TH1 and the second through portion TH2.

As described above, the through portion TH may be implemented in various shapes as well as a circular shape. To form the through portion TH itself in an elliptical shape (or a bar shape) as shown in FIG. 13, the substrate and structures on the substrate are exposed to a laser for a relatively longer time, which may cause defects in elements neighboring the through portion TH.

Therefore, the shapes of the through portion TH and the second non-display area NDA2 that are viewable from the outside (e.g., viewable by a user using the display device 2) may be variously implemented by designing the through portion TH itself in a shape formable for a minimum or reduced duration, and by arranging the dummy pixels DP around the through portion TH.

Figure 14:
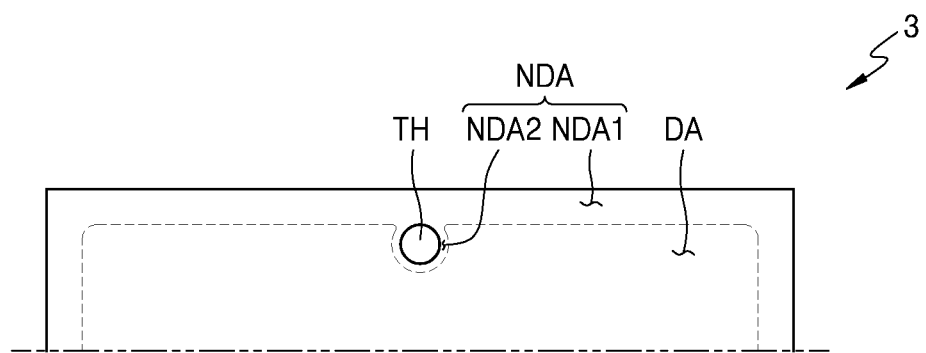
FIG. 14 is a plan view of a display device according to an exemplary embodiment.
Figure 15:
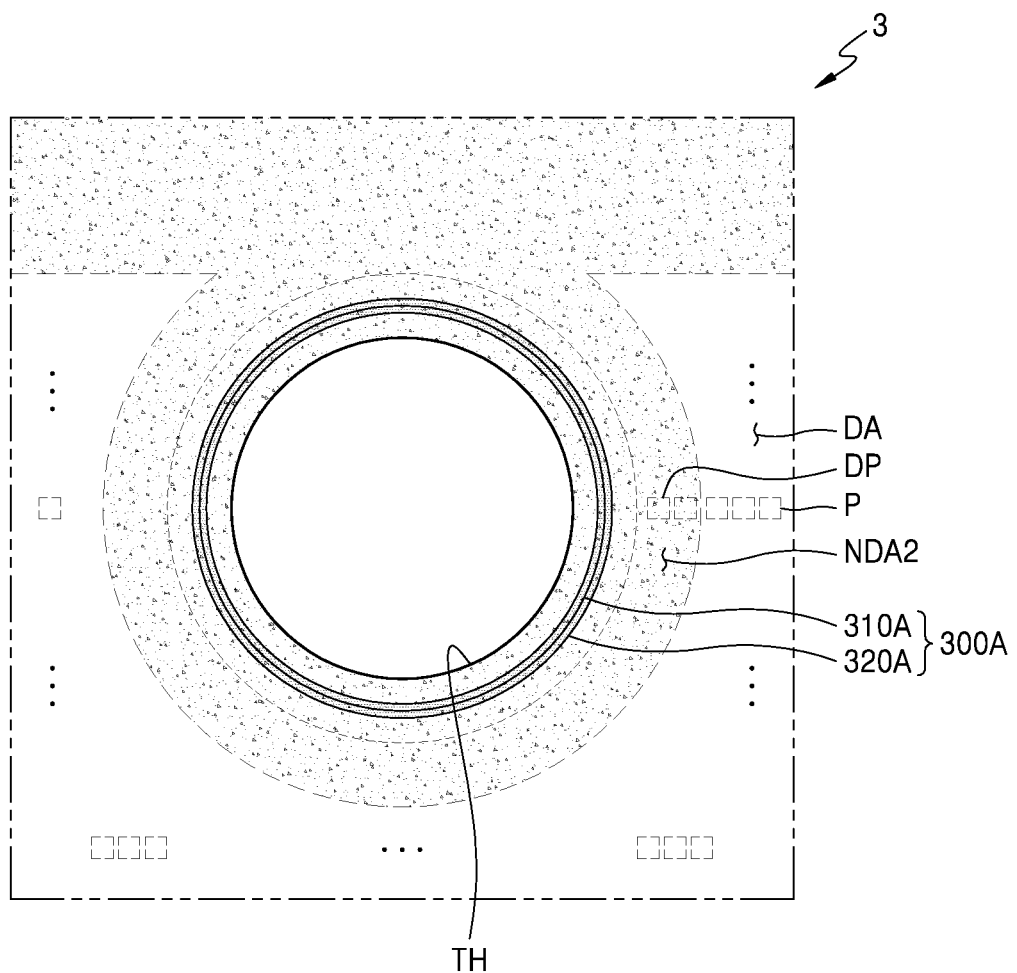
FIG. 15 is an enlarged plan view of a through portion in a display area of FIG. 14 according to an exemplary embodiment.

FIG. 14 is a plan view of a display device 3 according to an exemplary embodiment. FIG. 15 is an enlarged plan view of a through portion TH in a display area DA and a non-display area NDA of FIG. 14 according to an exemplary embodiment.

Exemplary embodiments of FIGS. 14 and 15 are different from the above-described exemplary embodiments in terms of a location of the through portion TH and a shape of the non-display area NDA around the through portion TH. For convenience of explanation, since the configuration otherwise is similar to that of the above-described exemplary embodiments, the through portion TH and the non-display area NDA are primarily described below, and a further description of components previously described may be omitted.

Referring to FIG. 14, in an exemplary embodiment, the display device 3 includes a first non-display area NDA1 surrounding at least a portion of an outer edge of the display area DA, and a second non-display area NDA2 surrounding at least a portion of an outer edge of the through portion TH between the through portion TH and the display area DA. The through portion TH is disposed in an upper central portion of the display area DA and is disposed adjacent to an edge of the substrate 100. In the above-described exemplary embodiments, the second non-display area NDA2 is surrounded by the display area DA. In contrast, in the exemplary embodiment described herein, the display area DA surrounds a portion of the second non-display area NDA2, and the rest of the second non-display area NDA2 is connected to the first non-display area NDA1.

In a case in which the display unit 10 emits light, the display area DA of the display device 3 in FIG. 14 may be recognized as if a U-shaped recess U were formed in a portion in which the through portion TH is disposed.

Referring to FIG. 15, although the crack prevention pattern 300A surrounding the through portion TH and the wiring connection unit 330 are substantially spaced apart from the first non-display area NDA1, it may be recognized as if the first non-display area NDA1 were visually connected with the second non-display area NDA2 through the dummy pixel unit 20 disposed between the first non-display area NDA1 and the wiring connection unit 330.

As described above, deterioration of an emission uniformity of pixels P neighboring the through portion TH may be prevented or reduced, and a visually displayed shape of the non-display area NDA may be freely implemented by designing a location and an area of the dummy pixel unit 20 as described herein according to exemplary embodiments.

Figure 16:
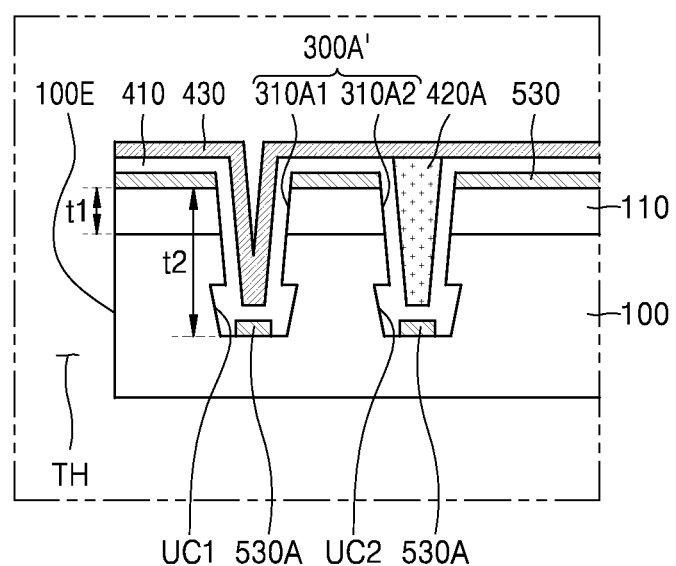
FIGS. 16 and 17 are enlarged cross-sectional views of a display device according to an exemplary embodiment.
Figure 17:
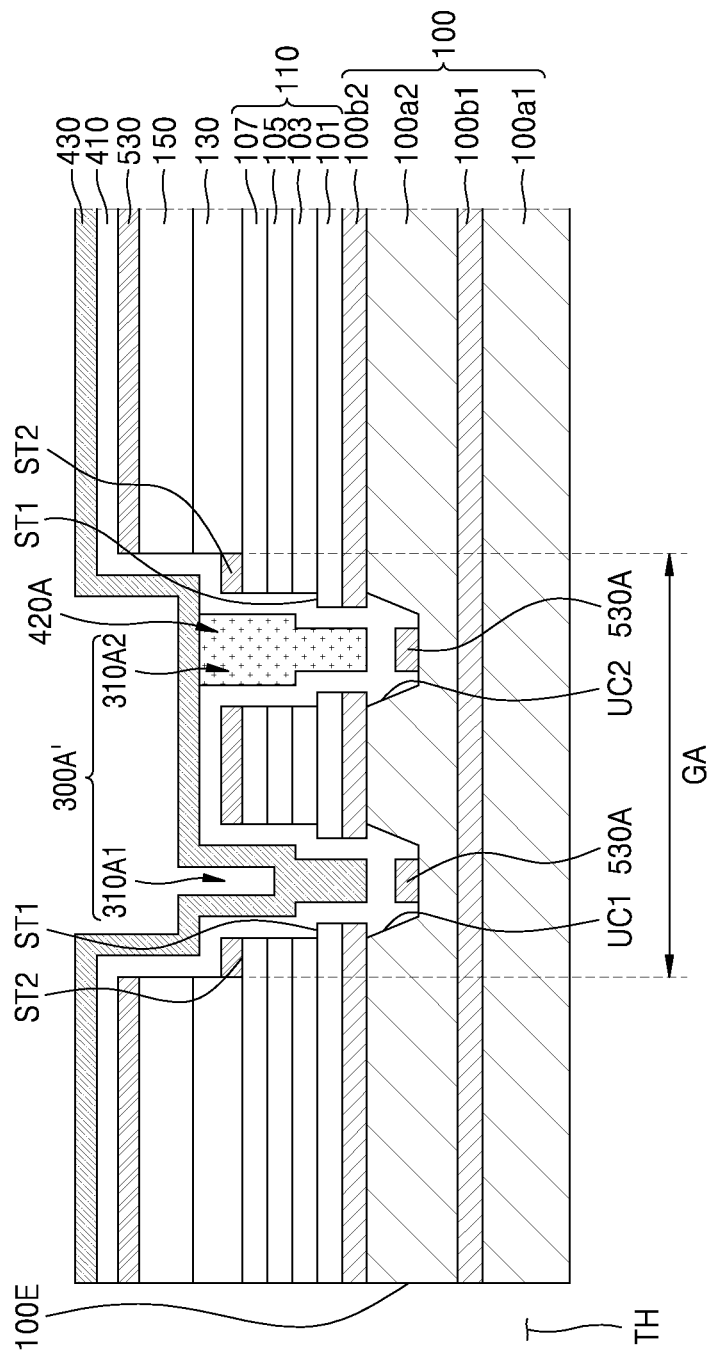

FIGS. 16 and 17 illustrate an exemplary embodiment of a crack prevention pattern 300A'. Referring to FIGS. 16 and 17, in an exemplary embodiment, the crack prevention pattern 300A' includes a first groove 310A1 and a second groove 310A2. The first and second grooves 310A1 and 310A2 may completely pass through the first insulating layer 110 and may extend to at least a portion of the substrate 100. For example, a depth t2 of the first and second grooves 310A1 and 310A2 may be greater than a thickness t1 of the first insulating layer 110.

Undercut-shaped step difference portions UC1 and UC2 may be formed at ends of the first and second grooves 310A1 and 310A2. Each of the first and second grooves 310A1 and 310A2 has a structure having a gradually reducing width toward the substrate 100 while extending in a direction of the substrate 100. The width of the first and second grooves 310A1 and 310A2 is relatively widened at the step difference portions UC1 and UC2. The opposite electrode 530 is disconnected as described below by the undercut shape of the step difference portions UC1 and UC2. Since the opposite electrode 530 is disconnected, a lateral moisture transmission path through an interface between the opposite electrode 530 and layers disposed adjacent thereto may be blocked.

The opposite electrode 530 and the inorganic encapsulation layers 410 and 430 may be disposed over the first and second grooves 310A1 and 310A2. The opposite electrode 530 and the inorganic encapsulation layers 410 and 430 may be disposed entirely over the substrate 100 and may extend to the edge 100E of the substrate 100. As described above, the opposite electrode 530 may be disconnected by the undercut shape of the step difference portions UC1 and UC2, and in this case, a portion 530A of the opposite electrode 530 may be disposed inside the first and second grooves 310A1 and 310A2.

The first groove 310A1 of the crack prevention pattern 300A' is disposed relatively adjacent to the through portion TH compared to the second groove 310A2. For example, the first groove 310A1 is disposed closer to the through portion TH compared to the second groove 310A2, and the second groove 310A2 is disposed closer to the display area DA compared to the first groove 310A1. The inside of the second groove 310A2 may be filled with an organic material 420A. The organic material 420A may be the same material as that of the organic encapsulation layer 420 of the encapsulation layer 400. In the second groove 310A2, the inorganic encapsulation layer 410 covers an inner surface of the second groove 310A2, the organic material 420A fills the inside of the second groove 310A2, and the inorganic encapsulation layer 430 covers the organic material 420A.

FIGS. 16 and 17 illustrate a stacked structure including the crack prevention pattern 300A' in more detail.

The substrate 100 of FIG. 17 may include a multi-layered structure of an organic/inorganic composite layer. For example, the substrate 100 includes first and second substrate layers 100a1 and 100a2 having a double-layered structure, and first and second barrier layers 100b1 and 100b2 are disposed alternately with the first and second substrate layers 100a1 and 100a2 disposed therebetween.

Similar to FIG. 8, the first insulating layer 110 including the buffer layer 101, the gate insulating layer 103, the dielectric insulating layer 105, and the interlayer insulating layer 107, the via layer 130, and the second insulating layer 150 are sequentially disposed on the substrate 100. A portion of the via layer 130 and the second insulating layer 150 corresponding to a groove area GA is removed. The crack prevention pattern 300A' including the first and second grooves 310A1 and 310A2 is disposed in the groove area GA.

The crack prevention pattern 300A' includes the first groove 310A1 disposed adjacent to the through portion TH, and the second groove 310A2 disposed outside the first groove 310A1. The first and second grooves 310A1 and 310A2 extend to the second substrate layer 100a2, and the undercut-shaped step difference portions UC1 and UC2 are formed between the second substrate layer 100a2 and the second barrier layer 100b2.

As illustrated in FIG. 17, the first and second grooves 310A1 and 310A2 may have step difference portions ST1 and ST2 between the buffer layer 101 and the gate insulating layer 103, and between the interlayer insulating layer 107 and the via layer 130.

While the present disclosure has been particularly shown and described with reference to the exemplary embodiments thereof, it will be understood by those of ordinary skill in the art that various changes in form and detail may be made therein without departing from the spirit and scope of the present disclosure as defined by the following claims.

What is claimed is:

1. A display device, comprising:
    a substrate having a non-display portion, a display area surrounding at least a portion of the non-display portion and a non-display area disposed adjacent to the display area;
    a display unit disposed on the first insulating layer in the display area and comprising a plurality of pixels surrounding of the non-display portion,
    wherein each pixel comprises a light-emitting element comprising a pixel electrode and an opposite electrode facing each other, and an emission layer disposed between the pixel electrode and the opposite electrode; and
    a dummy pixel unit comprising a plurality of dummy pixels disposed between the non-display portion and the display unit, and comprising a metal pattern comprising a same material as the pixel electrode,
    wherein the dummy pixels are disposed adjacent to the display unit.

2. The display device of claim 1, wherein the dummy pixels of the dummy pixel unit are disposed successive with the pixels of the display unit.

3. The display device of claim 1, further comprising:
    a first pixel circuit; and
    a second pixel circuit,
    wherein each of the first pixel circuit and the second pixel circuit comprises a thin film transistor disposed on the substrate,
    wherein a first pixel from among the plurality of pixels is electrically connected to the first pixel circuit, and a first dummy pixel from among the plurality of dummy pixels is electrically insulated from the second pixel circuit.

4. The display device of claim 3, further comprising:
    a via layer covering the first pixel circuit and the second pixel circuit,
    wherein the via layer planarizes a top surface of the via layer, and comprises a contact hole that electrically connects the first pixel to the first pixel circuit,
    wherein the contact hole is not disposed between the second pixel circuit and the metal pattern.

5. The display device of claim 3, wherein the pixel electrode is electrically connected to the thin film transistor of the first pixel circuit, and the metal pattern is electrically insulated from the thin film transistor of the second pixel circuit.

6. The display device of claim 1, further comprising:
    a second insulating layer covering an edge of the pixel electrode,
    wherein the second insulating layer exposes a portion of the pixel electrode and covers a top surface of the metal pattern.

7. The display device of claim 6, further comprising:
    an organic pattern disposed on the second insulating layer in an area corresponding to the metal pattern,
    wherein the organic pattern comprises a same material as the emission layer.

8. The display device of claim 7, wherein the metal pattern and the organic pattern are spaced apart from each other, and the second insulating layer is disposed between the metal pattern and the organic pattern.

9. The display device of claim 1, further comprising:
a second insulating layer comprising a first opening and a second opening,
wherein the first opening covers an edge of the pixel electrode and exposes a portion of the pixel electrode, and the second opening covers an edge of the metal pattern and exposes a portion of the metal pattern,
wherein the portion of the metal pattern exposed through the second opening contacts the opposite electrode.

10. The display device of claim 9, wherein the emission layer is disposed on the portion of the pixel electrode exposed through the first opening, and is not disposed on a remaining portion of the pixel electrode.

11. The display device of claim 1, further comprising:
a first insulating layer disposed on the substrate;
a groove disposed in the first insulating layer between the non-display portion and the dummy pixel unit.

12. The display device of claim 11, further comprising:
a cladding layer disposed on the first insulating layer,
wherein the cladding layer covers the groove and comprises a different material than the first insulating layer.

13. The display device of claim 11, wherein a depth of the groove is about equal to or less than a thickness of the first insulating layer.

14. The display device of claim 11, further comprising:
a wiring connection unit disposed between the groove and the dummy pixel unit.

15. The display device of claim 14, further comprising:
a spaced area disposed between the wiring connection unit and the dummy pixel unit.

16. The display device of claim 15, further comprising:
a metal layer having a ring shape,
wherein the metal layer is disposed over the spaced area and surrounds the non-display portion, and a diameter of the metal layer is greater than a diameter of the non-display portion.

17. The display device of claim 1,
wherein the non-display area comprises a first non-display area surrounding at least a portion of an outer edge of the display area comprising an edge of the substrate, and a second non-display area surrounding at least a portion of an outer edge of the non-display portion between the non-display portion and the display area.

18. The display device of claim 17, wherein the non-display portion is disposed adjacent to the edge of the substrate, and the first non-display area is connected to the second non-display area.

19. The display device of claim 1, wherein the non-display portion comprises:
a first through hole; and
a second through hole disposed adjacent to the first through hole,
wherein at least a portion of the dummy pixel unit is disposed between the first through hole and the second through hole.

20. The display device of claim 1, wherein an edge of the non-display portion comprises a single closed curve.

21. The display device of claim 11, wherein the groove passes through the first insulating layer and extends to at least a portion of the substrate.

22. A display device, comprising:
a substrate;
a non-display portion defined in the substrate
a first insulating layer disposed on the substrate;
a second insulating layer disposed on the first insulating layer;
a plurality of pixels surrounding at least a portion of the non-display portion,
wherein each pixel comprises a light-emitting element comprising a pixel electrode and an opposite electrode facing each other, and an emission layer disposed between the pixel electrode and the opposite electrode; and
a plurality of dummy pixels disposed between the non-display portion and the pixels, wherein each dummy pixel comprises a metal pattern comprising a same material as the pixel electrode,
wherein the second insulating layer comprises a plurality of openings that exposes every pixel electrode of the plurality of pixels, and the second insulating layer completely covers every metal pattern of the plurality of dummy pixels.

* * * * *